(12) United States Patent
Schuster et al.

(10) Patent No.: US 7,463,029 B2
(45) Date of Patent: Dec. 9, 2008

(54) GRADIENT COIL COOLING DEVICE AND METHOD AND GRADIENT COIL EMBODYING SAME

(75) Inventors: Johann Schuster, Oberasbach (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/692,246

(22) Filed: Mar. 28, 2007

(65) Prior Publication Data
US 2007/0247156 A1  Oct. 25, 2007

(30) Foreign Application Priority Data
Mar. 28, 2006  (DE) ........................ 10 2006 014 305

(51) Int. Cl.
G01V 3/00 (2006.01)
(52) U.S. Cl. ....................................... 324/318; 324/319
(58) Field of Classification Search ......... 324/318–322, 324/309; 165/80.2, 80.3, 80.4; 336/55, 61, 336/62
See application file for complete search history.

(56) References Cited

U.S. PATENT DOCUMENTS

| | | | |
|---|---|---|---|
| 4,592,261 A * | 6/1986 | Miyaji et al. ............... | 83/102.1 |
| 5,936,502 A * | 8/1999 | Englund et al. ............. | 335/299 |
| 6,111,412 A * | 8/2000 | Boemmel et al. ........... | 324/318 |
| 6,552,545 B2 * | 4/2003 | Kaindl et al. ............... | 324/318 |
| 6,741,152 B1 * | 5/2004 | Arz et al. .................... | 335/300 |
| 7,140,420 B2 * | 11/2006 | Arik et al. ................... | 165/80.2 |
| 7,154,270 B2 * | 12/2006 | Arz et al. .................... | 324/318 |
| 2001/0042385 A1 | 11/2001 | Kaindl et al. | |
| 2008/0024134 A1 * | 1/2008 | Schuster et al. ............. | 324/319 |

FOREIGN PATENT DOCUMENTS

| | | |
|---|---|---|
| DE | 197 22 211 A1 | 8/1998 |
| DE | 100 18 165 C2 | 8/2003 |
| DE | 102 35 055 A1 | 3/2004 |

* cited by examiner

Primary Examiner—Brij B Shrivastav
(74) Attorney, Agent, or Firm—Schiff Hardin LLP

(57) ABSTRACT

A cooling apparatus for arrangement between two surface coils of a gradient coil to dissipate the heat produced when current is supplied to the surface coils by a coolant flowing into the cooling apparatus, is formed as a flexible, mat-type surface structure, and has a coolant-holding space with at least one coolant inflow and at least one coolant outflow.

17 Claims, 2 Drawing Sheets

GRADIENT COIL COOLING DEVICE AND METHOD AND GRADIENT COIL EMBODYING SAME

BACKGROUND OF THE INVENTION

1. Field of the Invention

The present invention relates to a cooling apparatus for arrangement between two surface coils of a gradient coil for dissipating the heat produced when supplying current to the surface coils by means of a coolant flowing into the cooling apparatus.

2. Description of the Prior Art

Gradient coils for magnetic resonance devices essentially include triaxial magnetic field coils, which are cast in a resin matrix (usually epoxy resin), in order to produce the desired mechanical and electrical properties of the coil. The magnetic field coils are usually designed as surface coils having a carrier, onto which the coil conductors are applied and/or wound in a predetermined pattern. These surface coils are bent in order to produce the conventionally cylindrical gradient coils, generally describing a partial circle of a little less than 180°.

The surface coils are supplied with current in order to generate the gradient fields. Gradient currents of several hundred amperes with electrical voltages up to 2 kV are usual and result in power losses of usually >10 kW in the form of heat, which must be dissipated. For this purpose, each gradient coil has a cooling apparatus. In order to be able to dissipate the power as efficiently as possible, cooling tubes forming the cooling apparatus are embedded in the resin between the individual surface coils, which lie relatively closely together, with several 100 m of cooling tube per surface coil typically being provided as well as several parallel cooling circuits. The insertion and/or winding of the cooling tubes is very complex and time-consuming, because the cooling tubes are wound onto a supporting plate by hand and are fixed with waxed silk cords in through-holes in the supporting plate, with the tube ends being positioned directly adjacent to one another for the water inlet and outlet. It is furthermore disadvantageous that excessively narrow radii cannot be wound with a cooling tube typically in the form of a polyamide pipe, having an external diameter of 8 mm with a wall thickness of 1 mm, without risking excessive cross-sectional narrowing or the formation of a kink, sometimes resulting in zones which cannot be covered with a cooling tube.

SUMMARY OF THE INVENTION

An object of the present invention is to provide a gradient coil cooling apparatus that can be produced in a simple and cost-effective manner and enables the dissipation of large quantities of heat.

This object is achieved by cooling apparatus according to the invention that is designed as a flexible, mat-type surface structure, also having a coolant-holding space with at least one coolant inflow and at least one coolant outflow.

The cooling apparatus according to the invention is embodied in the nature of a mat, in other words as having a large area, and is designed in a flexible manner. This means that the cooling apparatus can be easily adjusted to the given geometry between the surface coils as a result of the flexibility, just as it can also be easily integrated into the intermediate space due to its minimal thickness resulting from the mat-type surface structure design. As a result of the flat design and the fact that the coolant can circulate through the entire inner space, the coolant-holding space, from inflow to outflow, a very large contact or heat-absorbing surface inevitably results in the direction of the heat sources, in other words the surface coils, so that there is an excellent heat exchange and it is possible to dissipate very large quantities of heat as a result of the large area covered.

Such a cooling apparatus in the form of a large surface structure can be produced significantly more easily than conventional cooling apparatuses, with which, as described, the several 100 m of cooling tubes must be wound manually onto the carrier and secured thereto. There are no regions, which are not covered by the cooling apparatus, as a result of the flat embodiment.

The cooling apparatus as a surface structure can be produced in a more simple manner for instance in that two flexible surface elements, which between them form the coolant-holding space, are connected to one another in a sealed manner, with only the at least one inflow and the at least one outflow being provided. These flexible surface elements are expediently made of plastic, preferably in the form of thin films, which preferably have a thickness $\leq 0.5$ mm, in particular $\leq 0.2$ mm. Plastic films of this type can be processed very easily, they can for example be easily thermally welded or glued to one another. Laser welding is a possible form of welding for example or connection by way of a hot plate method. Within the scope of adhesion, any adhesive applied to the material of the film can be used, said adhesive enabling a sufficiently permanent and sealed connection. Any thermoplastic plastic, which is sufficiently stable in respect of the temperatures resulting at the surface coils, can be used as the material.

As an alternative to connecting the two surface elements, it would basically also be conceivable to produce the flexible, mat-type hollow surface structure using a plastic blowing method as a one-piece component by using a suitable blowing mold.

In any case, it is expedient if the coolant-holding space is embodied in the form of one or several coolant channels. These coolant channels can be created in a very simple manner, particularly when using two surface structures connected to one another, which are welded or glued together, as only the surface structures, in other words the plastic films, are connected locally to one another to form the channel, according to the desired channel shape, width and geometry. In this process, a channel system can be formed if several coolant channels are present, with which channel system the individual coolant channels are independent of one another, consequently each coolant channel has its own inflow and outflow, in other words several parallel cooling circuits are provided. It would also be conceivable, based on a common coolant inflow, to branch the coolant into different channels and to combine these again to form a common coolant outflow. Finally, the shape, pattern and/or number of the coolant channel(s) is/are expediently based on the pattern of the coil windings of one or both adjacent surface coils of the gradient coil, for which the cooling apparatus is designed and/or provided.

The mat-type cooling apparatus according to the invention is likewise cast into the casting compound, an epoxy resin for instance, when casting the individual surface coils to form the gradient coil. To fix the structure, one or several distributed through-holes is/are expediently provided in the surface of the cooling apparatus, enabling passage of the casting compounds, said through-holes preferably already being able to be produced when connecting the surface structures, by for instance cutting out corresponding areas thermally by way of the hot pressure plates used for welding, or separating said areas by way of the welding laser. Naturally corresponding through-holes also cab be easily created, when producing the surface structure using a hollow blowing method.

Corresponding connecting pieces are expediently provided in each instance at the coolant inflows and outflows, these connecting pieces being able to be welded and/or glued simultaneously when welding the surface structures or when gluing the same into the inflow/outflow of the surface structure. It is naturally also possible only to fix these in place afterwards, with this preferably likewise being carried out by welding or gluing, also when the surface structure is produced by means of hollow blowing.

The cooling apparatus according to the invention can be produced in a very simple, rapid and cost-effective manner, since the complex winding and sewing of the cooling tubes to the supporting plates is completely dispensed with. It also offers a very large degree of freedom of configuration in respect of the embodiment of the surface structure and/or the shape of the coolant-holding space for embodying one or several coolant channels, series and parallel circuits can easily be embodied, the shape and route of the channels can be selected as desired and can be optimized to the individual, thermally coupled surface coils, with regard to local heat development. The radial design of the surface structure can be made very flat—with regard to integration in the gradient coil—compared with the round coolant tubes, so that it is possible to reduce the space requirement while improving cooling and very efficient gradient coil cooling can be achieved with minimal pressure loss. As a result of using extremely thin plastic films, a very minimal thermal resistance results. In other words, the heat conduction to the coolant is significantly more efficient compared with relatively thick plastic tubes, which ultimately also results in a more efficient gradient coil cooling.

In addition to the cooling apparatus, the invention further relates to a gradient coil, having at least one cooling apparatus of the described type arranged between surface coils.

Two such large-area and mat-type cooling apparatuses according to the invention are preferably provided, covering ≦180°. This means that the two cooling apparatuses complement each other to form a joint covered cooling surface of a little less than 360°, thus enabling cooling over the entire gradient coil periphery. It is also be conceivable to provide only one cooling apparatus, which covers ≦360°. A cooling mat of almost double the size is thus used here, which is positioned between two surface coils, which are adjacent to one another. Expediently the length of the or each cooling apparatus should essentially correspond to the length of the surface coils, so that optimum cooling is achieved over the entire surface, in which heat can develop due to losses.

The radial extension of the coolant-holding space or of the coolant channel(s) should expediently be ≦10 mm, in particular ≦5 mm. In conjunction with the use of extremely thin films to produce the mat-type cooling apparatus (the same applies to the configuration of corresponding wall thicknesses during production of the surface structure using a hollow blowing method), it is possible, if necessary, to make the radial structure very small, as an extremely large coolant volume is nevertheless available. This means that the available space can be even better utilized and/or the gradient coils can be arranged rather closer to one another.

Furthermore, the invention relates to a method for producing a gradient coil of the type described. Within the scope of this method, one or several cooling apparatuses of the type described at the start is/are arranged between two permanently positioned surface coils and/or—in respect of the entire periphery of the gradient coil—between four surface coils, each covering 180°, whereupon the one or several cooling apparatuses is/are filled with a filling medium, for instance air or water, and is/are therefore inflated and brought into surface contact with the adjacent surface coils, whereupon the surface coils and the filled cooling apparatus(es) are cast into a casting compound. The integrated cooling apparatuses are thus expanded using sufficiently high pressure prior to casting, so that they extend optimally in the available space between the surface coils, after which casting takes place. In this process, sufficient pressure must be built up in the cooling apparatuses in order to prevent collapse as a result of the hydrostatic pressure of the fluid resin compound. The casting compound expediently moistens the outer walls of the cooling apparatuses, so that after relieving the pressure, the cooling apparatuses remain in the extended open form, and consequently the coolant channels etc. are always open.

It is further expedient to subject the one or several cooling apparatuses to a corona discharge treatment prior to insertion between the surface coils, this being advantageous for a good connection between the material of the cooling apparatuses, usually the plastic films, and the casting compound, usually an epoxy resin.

DESCRIPTION OF THE PREFERRED EMBODIMENTS

Figure 1:
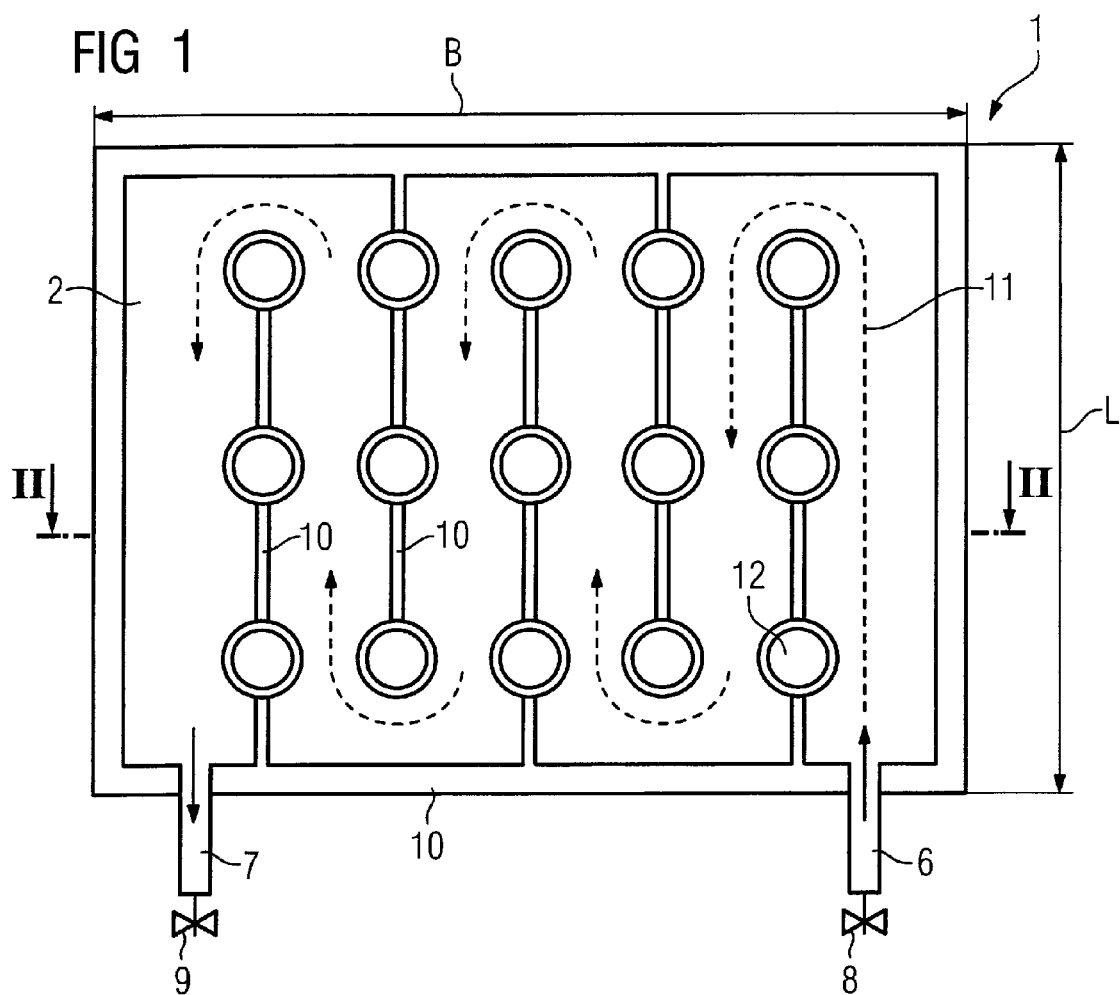
FIG. 1 shows a top view of a cooling apparatus according to the invention.
Figure 2:
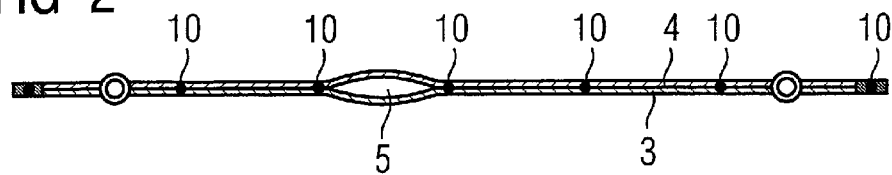
FIG. 2 shows a sectional view toward line II-II through the cooling apparatus from FIG. 1.

FIG. 1 shows a cooling apparatus 1 in accordance with the invention in the form of a flexible, mat-type surface structure 2, comprising two large-area surface elements 3, 4 (see FIG. 2), which are preferably plastic films, having a thickness of preferably approximately 0.2 mm. A coolant-holding space 5 is formed between the two surface elements 3, 4, which are, as described, flexible, as is illustrated in FIG. 2, where the two surface elements 3, 4 are shown at a distance from one another in the left half of the section, solely for illustration and explanation purposes, in order to show that these are separate parts which are not connected locally to one another and can subsequently be removed from one another, these parts forming a coolant-holding space between each other.

A coolant inflow 6 communicates into the coolant-holding space 5 and a coolant outflow 7 communicates out therefrom, each being able to be controlled, opened and closed by way of corresponding valves 8, 9. The coolant-holding space 5 is sealed laterally on its edges of a peripheral weld seam 10, see the top view. Different inner weld seams 10 are provided in a distributed manner over the surface. The weld seams provide the embodiment of a coolant channel 11, which is routed in a convoluted manner from the coolant inflow 6 to the coolant outflow 7. The direction of flow is indicated by the flow arrows.

It should be noted that instead of only the one coolant channel 11 in FIG. 1, several coolant channels optionally having separate inflow and outflows can also be created and provided by means of a corresponding arrangement and/or by a corresponding pattern of the inner weld seams 10.

Different sealed through-holes 12 are further provided in a distributed manner over the surface, said through-holes 12 enabling the passage of the casting compound, into which the cooling apparatus 1 is cast, as described below.

The length L of the cooling apparatus shown in FIG. 1 corresponds to the axial length of the surface coils, which are used to construct the gradient coil described below. The width B of the cooling apparatus 1 likewise essentially corresponds to the width of the surface coils, which, in the assembly position which is discussed in more detail below, are also bent like the cooling apparatus 1, with the cooling apparatus 1 being dimensioned in terms of its length B such that it essentially covers a partial periphery of approximately 180° or a little less.

Figure 3:
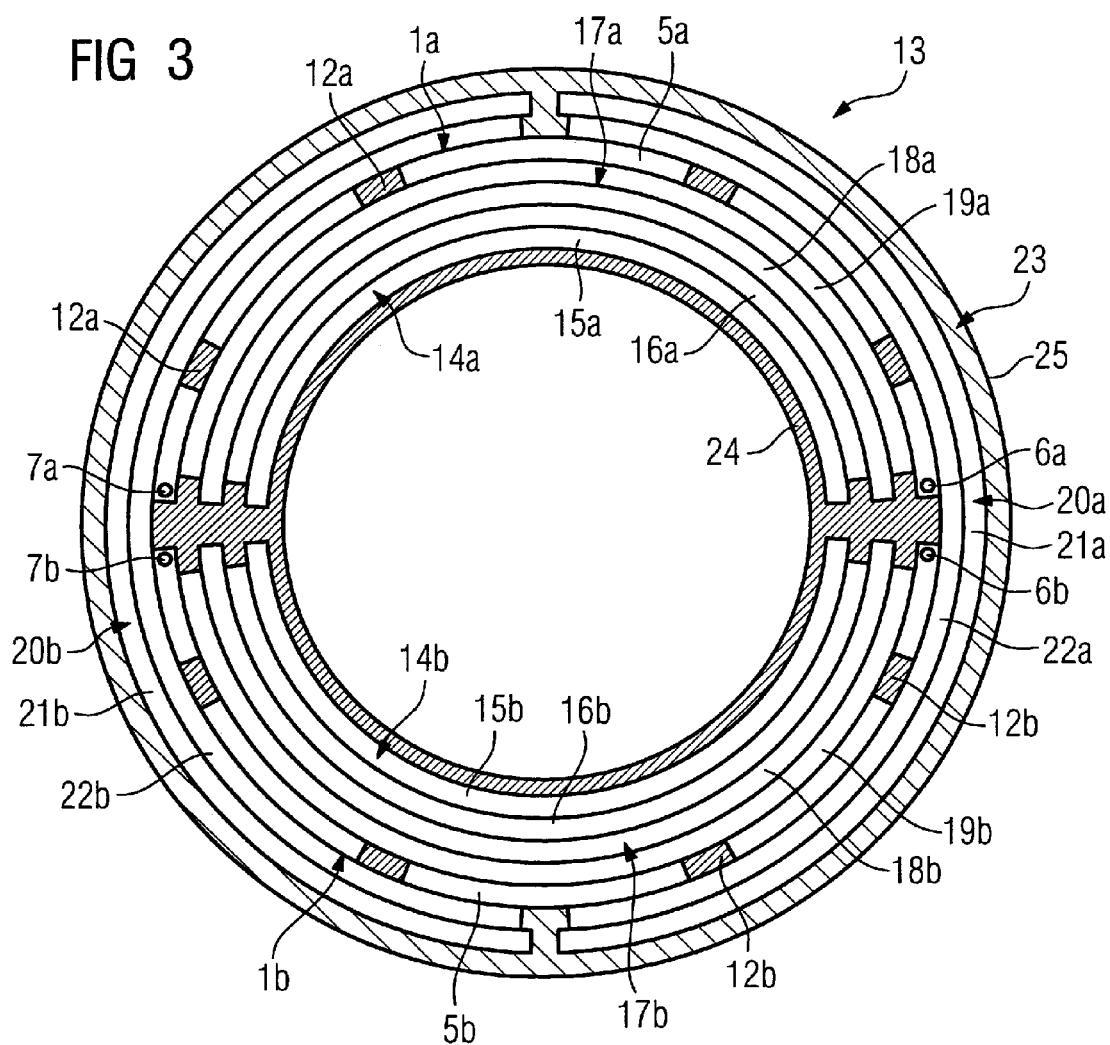
FIG. 3 shows a schematic diagram of an inventive gradient coil having two cast cooling apparatuses according to the invention in a sectional view.

FIG. 3 shows a schematic diagram of a sectional view through a gradient coil 13 according to the invention. It has a total of six surface coils, which lie in pairs on different radii. An inner pair of surface coils 14a, 14b and formed by respective coil carriers 15a, 15b and the coil windings 16a, 16b attached thereto are provided. A second pair of surface coils 17a, 17b, likewise having a coil carrier 18a, 18b in each instance with coil windings 19a, 19b attached thereto, immediately follows these in direct contact. A third pair of surface coils 20a, 20b is provided at a radial distance from this surface coil pair 17a, 17b, the surface coils likewise having a carrier 21a, 21b as well as corresponding windings 22a, 22b.

Two cooling apparatuses 1a, 1b according to the invention are inserted between the two pairs of surface coils 17a, 17b and 20a, 20b in the example shown. The surface coils 17a, 17b and/or 20a, 20b are arranged such that the coil windings 19a, 19b and/or 22a, 22b are directly adjacent to the cooling apparatuses 1a, 1b. In order to insert the cooling apparatuses 1a, 1b, the inner surface coils 14a, 14b and 17a, 17b are first constructed and fixed in a fixed position, whereupon the flexible mat-type cooling apparatuses 1a, 1b are positioned thereon. The outer surface coils 20a, 20b are then positioned in a fixed position. This entire structure is subsequently cast into a casting compound 23. This casting compound 23 forms both the inner surface 24 and also the outer surface 25 of the gradient coil 13 and fixes all the surface coils 14a, 14b, 17a, 17b, 20a, 20b as well as the cooling apparatuses 1a, 1b, which were inflated with high pressure prior to casting using a filling medium, thus fixed these in a fixed position and in such a manner that they cannot be removed after hardening. The extended cooling apparatuses 1a, 1b adhere to the casting compound so that the coolant-holding spaces 5a, 5b also remain open, even after the load has been removed from the cooling apparatuses 1a, 1b. The casting compound 23 also easily passes through the through-holes 12, which are provided on the cooling apparatuses 1a, 1b. To cool the gradient coil, the cooling apparatuses 1a, 1b are provided with coolant by way of the corresponding coolant inflows 6a, 6b, the coolant being removed by way of the corresponding coolant outflows 7a, 7b. Heat is effectively exchanged over a large area, over the entire surface of the adjacent surface coils toward the coolant, since the cooling apparatuses 1a, 1b cover the surface coils over almost the entire periphery. The heat lost from the surface coils 14a, 14b is transported by way of the adjacent surface coils 17a, 17b, which are thermally coupled to the inner surface coils 14a, 14b, to the coolant, preferably water.

It should finally be noted that the illustration shown in FIG. 3 is naturally not to scale, but is only of an exemplary and explanatory nature.

Although modifications and changes may be suggested by those skilled in the art, it is the intention of the inventors to embody within the patent warranted hereon all changes and modifications as reasonably and properly come within the scope of their contribution to the art.

We claim as our invention:

1. A cooling apparatus for dissipating heat generated by surface coils, of a gradient coil arrangement, supplied with current, said cooling apparatus comprising:
    a flexible mat configured for arrangement between two surface coils of a gradient coil arrangement; and
    said flexible mat consisting of two flexible surface elements sealed connected to each other to form an interior coolant-holding space therebetween in fluid communication with at least coolant inflow and at least one coolant outflow also formed in said mat.

2. A cooling apparatus as claimed in claim 1 wherein said coolant-holding space comprises at least one coolant channel in the interior of said mat.

3. A cooling apparatus as claimed in claim 2 wherein said coolant holding space has a plurality of coolant channels formed by said flexible surface elements, each being in common fluid communication with said coolant inflow and with said coolant outflow.

4. A cooling apparatus as claimed in claim 2 wherein said coolant holding space comprises a plurality of coolant channels formed by said flexible surface elements, and wherein said coolant inflow comprises a plurality of coolant inlets respectively in fluid communication with said plurality of coolant channels, and wherein said coolant outflow comprises a plurality of coolant outlets respectively in fluid communication with said plurality of coolant channels.

5. A cooling apparatus as claimed in claim 1 wherein said mat is comprised of plastic.

6. A cooling apparatus as claimed in claim 1 wherein said said two flexible surface elements are two films sealingly connected with each other.

7. A cooling apparatus as claimed in claim 6 wherein each of said films has a thickness that is less than or equal to 0.5 mm.

8. A cooling apparatus as claimed in claim 7 wherein each of said films has a thickness that is less than or equal to 0.2 mm.

9. A cooling apparatus as claimed in claim 6 wherein said films are sealingly connected by a seal selected from the group consisting a welded seal and a glued seal.

10. A cooling apparatus as claimed in claim 1 wherein said mat comprises at least one through-hole therein, communicating with an exterior of said mat, and configured to enable passage of a casting compound therethrough.

11. A cooling apparatus as claimed in claim 1 wherein said gradient coils have a coil conductor configuration, and wherein said coolant-holding space comprises at least one coolant channel, and wherein said at least one coolant channel has a characteristic selected from the group consisting of shape, pattern and number that is dependent on said pattern of said coil conductor of at least one of said surface coils.

12. A gradient coil arrangement comprising:
    two surface coils that generate heat when supplied with current; and
    a cooling apparatus disposed between said two surface coils that dissipates said heat, said cooling apparatus comprising at least one flexible mat consisting of two flexible surface elements sealed connected to each other and an interior coolant-holding space therebetween, and at least one coolant inflow and at least one coolant outflow in fluid communication with said coolant-holding space.

13. A gradient coil arrangement as claimed in claim 12 wherein said cooling apparatus comprises two mats, each covering less than or equal to 180° of an area between said surface coils.

14. A gradient coil arrangement as claimed in claim 12 wherein said cooling apparatus comprises a single mat covering less than or equal to 360° of an area between said surface coils.

15. A gradient coil arrangement as claimed in claim 12 wherein each of said surface coils comprises a coil conductor having a conductor length, and wherein said coolant-holding space comprises a channel in said at least one mat, and wherein said channel has a channel length substantially equal to the conductor length of at least one of said surface coils.

16. A gradient coil arrangement as claimed in claim 12 wherein said coolant holding space has a radial dimension that is less than or equal to 10 mm.

17. A gradient coil arrangement as claimed in claim 16 wherein said coolant-holding space has a radial dimension that is less than or equal to 5 mm.

* * * * *